United States Patent
Sundstrom et al.

(10) Patent No.: US 8,009,429 B1
(45) Date of Patent: Aug. 30, 2011

(54) ELECTRICAL COMPONENT THERMAL MANAGEMENT

(75) Inventors: Lance L. Sundstrom, Pinellas Park, FL (US); Rainer Blomberg, Palm Harbor, FL (US); Michael J. Gillespie, Seminole, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/728,947

(22) Filed: Mar. 22, 2010

(51) Int. Cl.
*H05K 7/20* (2006.01)

(52) U.S. Cl. ........ 361/719; 361/704; 361/707; 361/760; 257/706; 257/712

(58) Field of Classification Search .......... None
See application file for complete search history.

(56) References Cited

U.S. PATENT DOCUMENTS

| | | | |
|---|---|---|---|
| 4,396,936 A | 8/1983 | McIver et al. | |
| 5,703,753 A | 12/1997 | Mok | |
| 5,924,191 A | 7/1999 | Credle, Jr. et al. | |
| 5,982,031 A | 11/1999 | Stockmeier | |
| 6,181,556 B1 | 1/2001 | Allman | |
| 6,278,607 B1 | 8/2001 | Moore et al. | |
| 6,472,741 B1 * | 10/2002 | Chen et al. | 257/712 |
| 6,477,052 B1 | 11/2002 | Barcley | |
| 6,498,394 B1 | 12/2002 | Fehr | |
| 6,608,379 B2 | 8/2003 | Yeo et al. | |
| 6,681,482 B1 * | 1/2004 | Lischner et al. | 29/840 |
| 6,735,086 B1 | 5/2004 | Weber et al. | |
| 6,946,190 B2 | 9/2005 | Bunyan | |
| 6,975,025 B2 * | 12/2005 | LeBonheur et al. | 257/700 |
| 7,019,976 B1 | 3/2006 | Ahmad et al. | |
| 7,375,974 B2 * | 5/2008 | Kirigaya | 361/752 |
| 7,477,527 B2 | 1/2009 | Suhir | |
| 7,579,217 B2 | 8/2009 | Zhao et al. | |
| 7,592,695 B2 | 9/2009 | Reis et al. | |
| 7,705,447 B2 * | 4/2010 | Ganesan et al. | 257/713 |
| 7,759,169 B2 * | 7/2010 | Filoteo et al. | 438/122 |
| 2004/0099945 A1 | 5/2004 | Ku | |
| 2009/0002950 A1 | 1/2009 | Gertiser et al. | |
| 2009/0057871 A1 | 3/2009 | Zhao et al. | |
| 2009/0109624 A1 | 4/2009 | Chan et al. | |

* cited by examiner

*Primary Examiner* — Boris L Chervinsky
(74) *Attorney, Agent, or Firm* — Shumaker & Sieffert, P.A.

(57) ABSTRACT

Thermal management features are described for use with electrical components. In some examples, an assembly includes a printed board that includes a thermally conductive thermal attach pad thermally connected to a heat sink, an electrically conductive attach pad that is separate from the thermally conductive attach pad, and an electrically conductive trace electrically connected to the electrically conductive attach pad. An electrical component can be electrically connected to the electrically conductive attach pad and the electrically conductive trace of the printed board. A thermal interface material is disposed adjacent at least a portion of a side surface of the electrical component and in contact with the thermally conductive attach pad. In this manner, the assembly may provide a thermally conductive pathway from an electrical component to the heat sink.

20 Claims, 7 Drawing Sheets

ELECTRICAL COMPONENT THERMAL MANAGEMENT

STATEMENT REGARDING FEDERALLY SPONSORED RESEARCH OR DEVELOPMENT

This invention was made with Government support under Contract Number 4089 awarded by Lockheed Martin Corporation. The Government has certain rights in the invention.

TECHNICAL FIELD

This disclosure relates to electrical components and, more particularly, to electrical components mounted on a printed board.

BACKGROUND

A printed board assembly (PBA) can be fabricated using many different techniques. One technique is a through-hole mounting technique that utilizes individual electronic components with mounting lead pins. The lead pins of the individual components can be inserted into through-holes from a first side of a printed board and then soldered from an opposite side of the printed board (PB). Another technique for coupling electrical components to a printed board utilizes surface mount technology (SMT). SMT involves mounting a surface-mount device (SMD) or surface-mount component (SMC) directly onto conductive attach pads of a PB.

SUMMARY

In general, this disclosure relates to an assembly that includes one or more thermal management features for managing heat generated by an electrical component and techniques for forming the assembly. The electrical component is disposed on a substrate (e.g., a printed board) that includes at least one electrically conductive electrical attach pad and at least one thermally conductive thermal attach pad that is thermally connected to a thermal heat sink. In some examples, a printed board includes the heat sink, which can be, but need not be, separate from the electrically conductive trace. In other examples, the heat sink is external to the printed board. In some examples, the substrate includes a thermal via that is thermally connected to the thermal attach pad to the heat sink. The thermal attach pad is separate from the electrical attach pad. In addition, in some examples, the thermal attach pad is electrically isolated from the electrical attach pad to which an electrical component is electrically coupled.

Various thermal management features of the assembly may provide a dedicated pathway for transferring heat away from an electrical component. In some cases, for example, the thermal attach pad is thermally connected to the electrical component, e.g., via a thermal interface material alone or in combination with a thermal bridge, which defines a thermally conductive pathway from the electrical component to the heat sink. Thus, the thermal interface material and thermal pad help to transfer heat from the electrical component to the heat sink. In further cases, a thermally conductive attach pad, thermal via, and heat sink provide a dedicated pathway for conducting heat away from the electrical component.

In one aspect, the disclosure is directed to an assembly comprising a printed board that includes a heat sink, a thermal conductive attach pad thermally connected to the heat sink, an electrically conductive attach pad that is separate (e.g., physically spaced away from, does not overlap with, or separated by a substrate material) from the thermally conductive attach pad, and an electrically conductive trace. The assembly further includes an electrical component electrically connected to the electrically conductive attach pad and the electrically conductive trace of the printed board, where the electrical component defines a side surface. In addition, a thermal interface material is disposed adjacent at least a portion of the side surface of the electrical component, and is thermally connected to the thermally conductive attach pad. For example, the thermal interface material can contact the thermally conductive attach pad.

In another aspect, the disclosure is directed to an assembly comprising a printed board that includes a heat sink, a thermally conductive attach pad thermally connected to the heat sink, an electrically conductive attach pad that is separate from the thermally conductive attach pad, and an electrically conductive trace. The assembly further includes an electrical component electrically connected to the electrically conductive attach pad and trace of the printed board, where the electrical component defines a side surface, and a thermal bridge that surrounds at least a portion of the side surface of the electrical component. In addition, a thermal interface material is disposed at least partially between the thermal bridge and the electrical component, and is thermally connected to the thermally conductive attach pad.

In another aspect, the disclosure is directed to a method comprising electrically connecting an electrical component to an electrically conductive attach pad of a printed board, where the printed board further comprises a thermally conductive attach pad thermally connected to a heat sink, and where the thermally conductive attach pad is separate from the electrically conductive attach pad. The method further includes introducing a thermal interface material adjacent at least portion of a side surface of the electrical component so the thermal interface material is thermally connected to the thermally conductive attach pad.

The details of one or more embodiments of the invention are set forth in the accompanying drawings and the description below. Other features, objects, and advantages of the invention will be apparent from the description and drawings, and from the claims.

DETAILED DESCRIPTION

Thermal management features for an assembly that includes at least one electrical component are described herein. Some electronic assemblies include one or more electrical components, such as one or more discrete components and/or one or more integrated circuit (IC) components, mounted on a substrate (e.g., a printed board). Discrete components are individual circuit elements, such as transistors, diodes, resistors, capacitors, inductors, and the like. IC components, by contrast, contain two or more circuit elements in single circuit package. More complex circuits can be formed by electrically connecting multiple discrete components, multiple IC components, or a combination of discrete components and IC components. Regardless of the number, configuration, or type of electrical components, in some cases it may be desirable to manage the heat generated by the electrical components during operation. Better thermal management of electrical components can help increase the density with which electrical components can be attached to a printed board and, in some examples, improve performance of the electrical components by, for example, reducing their operating temperature.

Figure 1:
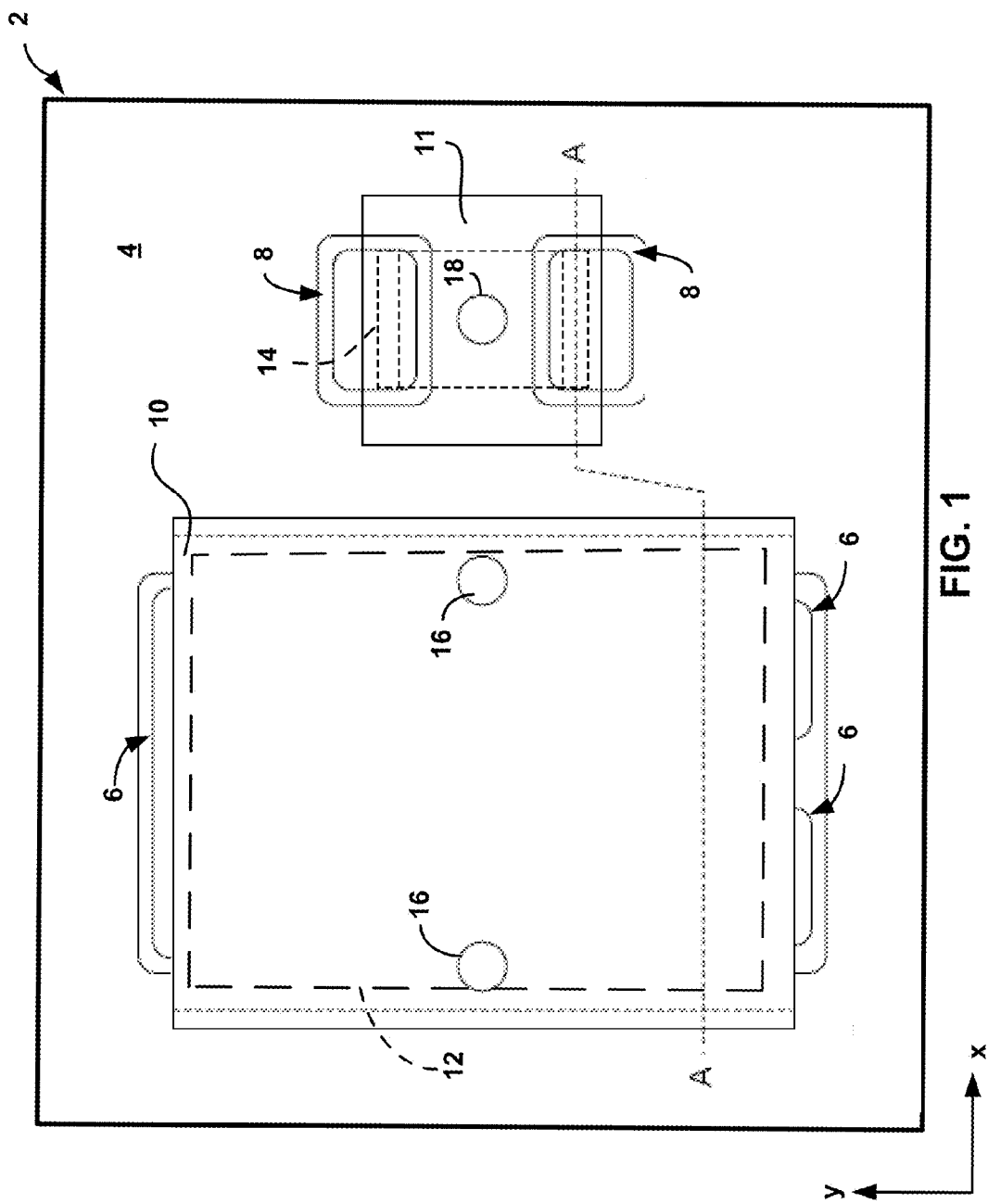
FIG. 1 is a schematic plan view of an example assembly that includes two electrical components, a substrate, and one or more thermal management features.

FIG. 1 is a schematic plan view of an example assembly 2, which includes printed board 4, thermal bridges 10, 11, and electrical components 12, 14. Assembly 2 includes thermal management features for managing heat generated by electrical components 12 and 14. Assembly 2 can also be referred to as a printed board assembly (PBA), printed wiring assembly (PWA), or a circuit card assembly (CCA). Printed board 4 mechanically supports electrical components 12 and 14. In addition, printed board 4 includes one or more electrically conductive attach pads and pathways that can be electrically connected to electrical components 12 and 14. A plurality of electrically conductive pathways of printed board 4 can be defined by, for example, electrically conductive material defining electrically conductive attach pads, vias, and/or traces within an electrically nonconductive material.

Figure 3:
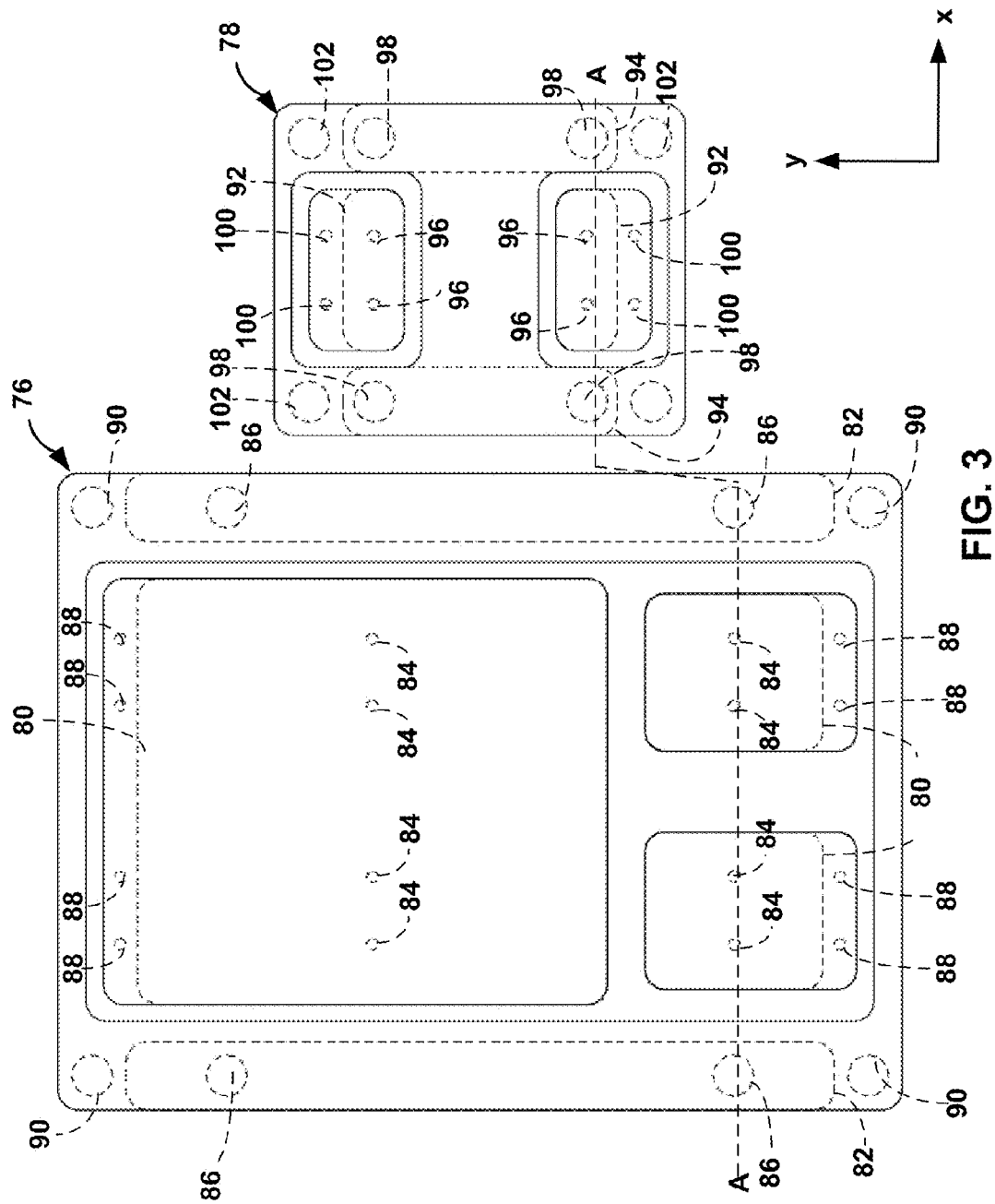
FIG. 3 is a schematic plan view of example attach pads that can be used to mount two example electrical components and their respective thermal bridges to a substrate.
Figure 4:
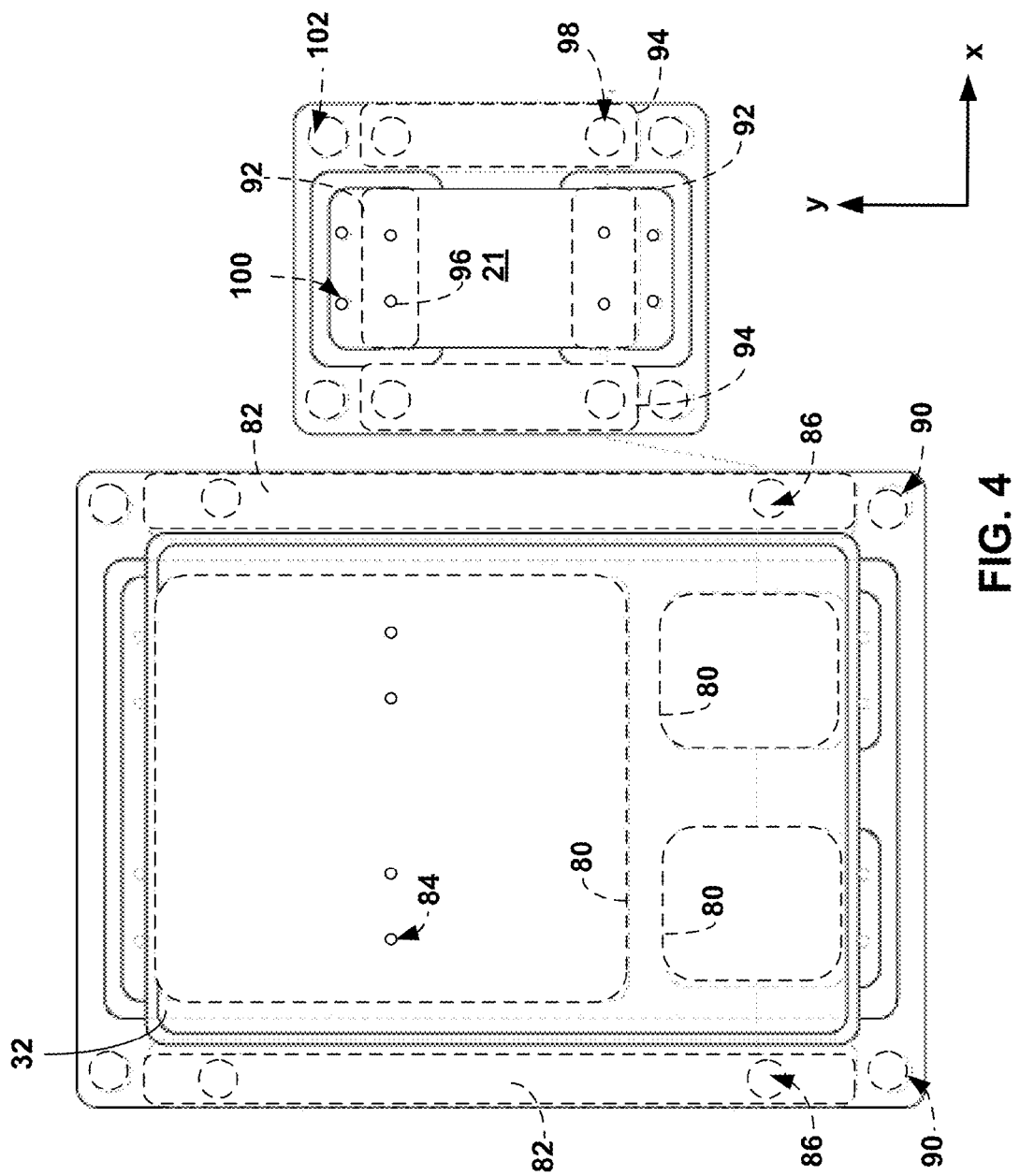
FIG. 4 is a schematic plan view of the two example electrical components mounted on the attach pads illustrated in FIG. 3.

In the example shown in FIG. 1, electrical components 12 and 14 are both electrically and mechanically connected to printed board 4 via a plurality of electrically conductive attach pads 6, 8, examples of which are described in further detail with respect to FIGS. 3 and 4. However, in other examples, other techniques for mechanically and electrically connecting electrical components 12 and 14 to printed board 4 can also be used. For example, an adhesive, such an electrically and/or thermally conductive adhesive, or another mechanical fixation mechanism (e.g., a screw or bolt) can be used to mechanically or electrically connect one or both electrical components 12, 14 to printed board 4. In some cases, a platform or a package housing can be at least partially positioned between one or both electrical components 12, 14 and printed board 4. That is, in some examples, one or both electrical components 12, 14 can be enclosed within a housing that is attached to printed board 4.

In some cases, electrical components 12 and 14 may be electrically connected to each other via electrically conductive attach pads, electrically conductive vias, electrically conductive traces, or a combination of electrically conductive features of printed board 4. In other cases, electrical components 12 and 14 may not share an electrically conductive pathway provided by printed board 4 and may instead be merely physically adjacent each other on a common printed board 4.

Electrical components 12, 14 can generate heat during operation. It may be useful to transfer heat away from components 12, 14, and, in some cases, away from printed board 4 in order to decrease the operating temperature of electrical components 12, 14. Assembly 2 includes one or more thermal management features that help transfer heat away from electrical components 12, 14. In the examples shown in FIG. 1, assembly 2 includes first thermal bridge 10 disposed over electrical component 12 and second thermal bridge 11 disposed over electrical component 14. As described in further detail below, thermal bridges 10, 11 are attached to thermally conductive attach pads (also referred to herein as "thermal attach pads") defined on printed board 4 (not shown in FIG. 1). The thermal attach pads are separate from the electrical attach pads 6, 8. In some examples, the thermal attach pads are physically separate from electrical attach pads 6, 8, such that each of the thermal attach pads defines an outer perimeter that does not substantially overlap with an electrical attach pads 6, 8. In addition, in some examples, the thermal attach pads are separated from an electrical attach pad 6, 8 by a substrate material of printed board 4, where the substrate material can be electrically nonconductive.

Further, the thermal attach pads are thermally connected to the respective electrical components 12, 14 as well as to a heat sink of printed board 4. In this way, thermal bridges 10, 11 and associated thermal attach pads form a thermally conductive pathway from electrical components 12, 14 to a heat sink. Thermal bridges 10, 11 at least partially surround an outer surface of electrical components 12, 14 and increase the surface area from which heat is conducted away from components 12, 14 (e.g., the thermal interface area) compared to assemblies that do not include a thermal bridge, and, e.g., rely on an electrical pathway between electrical components 12, 14 and printed board 14 to transfer heat away from components 12, 14. The outer surface of an electrical component can include, for example, a top surface that is opposite the bottom surface that is closest to printed board 4 when the component is attached to printed board 4 and a side surface that extends between the top surface and the bottom surface. Thermal bridges 10, 11 may be electrically insulated from or electrically connected to electrical components 12, 14 depending on the application.

In the example shown in FIG. 1, thermal bridge 10 defines fill ports 16 and thermal bridge 10 define fill port 18. As described in further detail below, a thermal interface material (TIM) can be introduced into a space between an outer surface of electrical component 12 and an inner surface of thermal bridge 10 via fill ports 16, and a thermal interface material can be introduced into a space between an outer surface of electrical component 14 and an inner surface of thermal bridge 11 via fill port 18. Fill ports 16, 18 can be, for example, openings defined in a wall of thermal bridges 10, 11, respectively, that extend from an outer surface of the respective thermal bridge 10, 11 to an inner surface that faces the respective electrical component 12, 14. Thermal bridges 10, 11 can each include any suitable number of fill ports, and the fill ports can have any suitable location. Thus, while two fill ports 16 at a top surface of thermal bridge 10 and a single fill port 18 at a top surface of thermal bridge 11 are shown in FIG. 1, in other examples, fill ports 16, 18 can have any suitable location in the wall of thermal bridges 10, 11, respectively. Thermal bridge 10 can include a greater or fewer number of fill ports and thermal bridge 11 can include a greater number of fill ports. Moreover, in some examples, thermal bridges 10, 11 do not include fill ports and the thermal interface material can be positioned between thermal bridges 10, 11 and electrical components 12, 14 using a different technique.

Electrical components 12, 14 may each be any generally known discrete component or IC component, and may even be a combination of one or more discrete components and one or more ICs. For example, electrical component 12 and/or 14 may be a transistor, such as a bipolar transistor, or field effect transistor (FET). In some cases, a field effect transistor (FET) may be a junction field effect transistor (JFET), a metal oxide semiconductor field effect transistor (MOSFET), a metal semiconductor field effect transistor (MESFET), or a high electron mobility transistor (HEMT). As another example, electrical component 12 and/or 14 may be a diode, such as Shottkey diode, dual Shottkey diode, Zener diode, transient voltage suppression diode, or a thyristor. It should be appreciated, however, that the preceding examples of discrete components are intended to be illustrative only, and the assemblies and techniques of this disclosure are not limited to a particular type of electrical component or combination of components. Thermal management of some discrete components can be more difficult than some IC components because the discrete components may have significantly smaller surface areas from which heat can be effectively conducted away from the discrete components. However, the thermal management features and techniques described herein can also be used with an assembly that includes one or more IC components. For example, electrical component 12 and/or 14 may be a flip-chip, such as a flip-chip that includes balled or bumped solder die surface, or a flat pack IC package.

Figure 2:
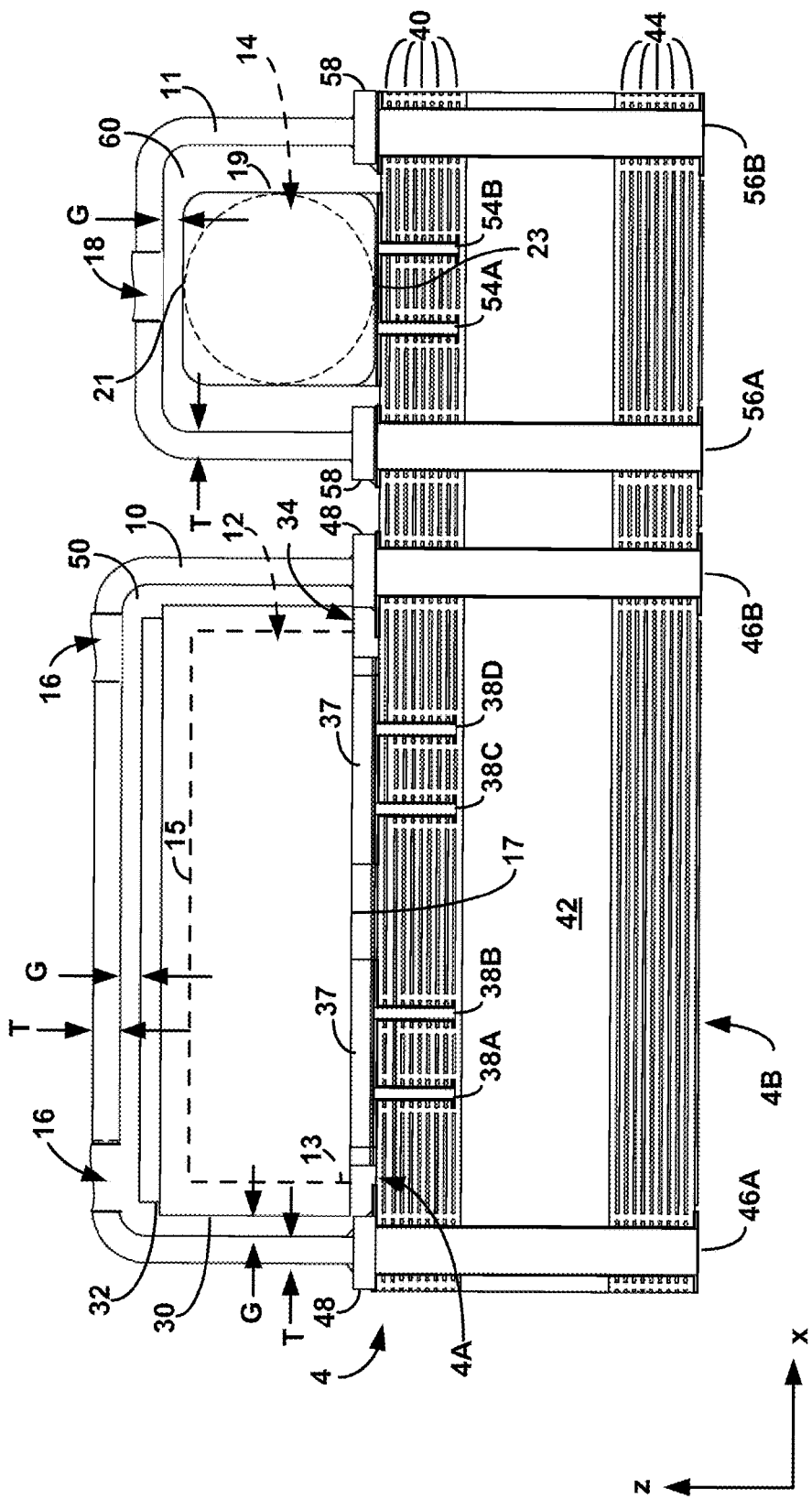
FIG. 2 is a schematic cross-sectional view of the example assembly of FIG. 1 taken along the A-A cross-sectional line shown in FIG. 1.

FIG. 2 is a schematic cross-sectional view of assembly 2 illustrated in FIG. 1 taken along line A-A in FIG. 1. Electrical components 12 and 14 are mounted to printed board 4. Any suitable number of electrical components can be mechanically and electrically coupled to printed board 4, which can have any suitable size. Printed board 4 includes electrically conductive vias 38A-38D, 54A-B, electrically conductive traces 40 and 44, thermal core heat sink layer 42, and thermally conductive vias 46A, 46B, 56A, 56B (also referred to as "thermal vias").

In some examples, printed board 4 may be a twenty-one layer printed board having ten 1 ounce (oz) (approximately 0.0356 millimeter (approximately 0.0014 inches) thick) and/or 2 oz (approximately 0.0711 millimeter (approximately 0.0028 inches) thick copper conductor layers in a top section and a single approximately 2.794 millimeter (approximately 0.110 inches) thick copper thermal core layer. A twenty-one layer printed board may also have ten 1 oz (approximately 0.0356 millimeter (approximately 0.0014 inches) thick) and/or 2 oz (approximately 0.0711 millimeter (approximately 0.0028 inches) thick) copper conductor layers in a bottom section, resulting in a centered copper thermal core layer between equally sized top and bottom sections. A twenty-one layer printed board may be used for a power supply application and may be obtained from Time to Market (TTM) Technologies, Inc. (Santa Ana, Calif.).

In other examples, printed board 4 can comprise any suitable type of board. For example, printed board 4 may have a single conductive layer, dual conductive layers, or a plurality of conductive layers. Printed board 4 generally includes at least one electrical trace or electrical trace layer (also referred to as a conductor layer) and one heat sink layer. However, printed board 4 may have a different number of electrical trace layers, a different number of heat sinks or heat sink layers, or a different configuration of electrical trace layers to the heat sink than that shown in FIG. 2. Moreover, the heat sink can have a different position relative to the electrical trace layers of printed board 4. For example, the heat sink can be positioned on a top surface or a bottom surface of printed board 4, or can even be physically separate from printed board 4.

In the example shown in FIG. 2, electrical component 12 defines a side surface 13, a top surface 15, a bottom surface 17. A side surface can be any surface other than a top surface or a bottom surface, where the bottom surface is closest to printed board 4 when the electrical component is attached to printed board 4 and the top surface is substantially opposite the bottom surface. An electrical component may have a single side surface or multiple side surfaces. In some cases, electrical component 12 may include leads configured to extend through printed board 4 to mount component 12 using a through-hole mounting technique. In other cases, as illustrated in FIG. 2, electrical component 12 may be electrically and mechanically coupled to printed board 4 via surface mount technology (SMT) techniques. For example, electrical component 12 can be electrically and mechanically coupled to printed board 4 by electrical attach pad 37, as described in further detail below with respect to FIG. 3. As an example, interfacial attach pads on component 12 can be mated with interfacial attach pads of printed board 4, and the attach pads can be soldered or adhered together. Additional or alternate fixation mechanisms, such as an adhesive, screw, bolt or the like can also be used.

Electrical component 12 can be directly connected to printed board 4, or may a part of a package (e.g., a housing or a platform) that is mechanically connected to printed board 4. For example, electrical component 12 can reside within a package that mounts directly to conductive patterns on a top surface of printed board 4 using surface mount technology (SMT) techniques. The package housing may protect electrical component 12 from the environment (e.g., environmental contaminants), facilitate placement and fabrication of assembly 2, and, in some examples, help transfer heat away from electrical component 12.

As an example, electrical component 12 may reside in a cavity defined by housing 30. Housing 30 comprises housing bottom member 34 that defines a surface that is adjacent to printed board 4 when housing 30 is mechanically coupled to printed board 4. Housing lid 32 can be mechanically coupled to housing 30 to substantially enclose electrical component 12 within the cavity defined by housing 30. In some examples, housing lid 32 and housing 30 define a hermetically sealed package, such that electrical component 12 may be hermetically sealed within housing 30.

In some cases, electrical attach pads 37 electrically connect electrical component 12 to printed board 4. For example, electrical attach pads 37 may be electrically connected to an electrically conductive pathway defined within housing bottom member 34, which is electrically connected to electrical component 12. In some examples, electrical attach pads 37 are electrically connected to at least one of electrical vias 38A-38D. In this way, electrical component 12 housed within housing 30 can be electrically connected to electrical attach pads 37 and at least one electrical via 38A-38D of printed board 4. In other examples, electrical component 12 can directly electrically connect to electrical attach pads 37 via respective attach pads, rather than electrically connecting to attach pads 37 via housing 30, as shown in FIG. 2. That is, in some examples, electrical component 12 may not be enclosed within housing 30.

Assembly 2 also includes electrical component 14. Electrical component 14 defines a side surface 19, a top surface 21, and a bottom surface 23. In the example shown in FIG. 2, electrical component 14 is electrically connected to one of electrically conductive traces 40 via an electrical attach pad (not shown) that is electrically connected to at least one of electrical vias 54A, 54B. For example, bottom surface 23 of electrical component 14 can include an electrical contact (e.g., electrically conductive attach pad) that electrically connect to an electrical attach pad of printed board 4. The electrical conductive attach pad of printed board 4 can be positioned on a top surface of printed board 4 and can be electrically connect to at least one of electrical vias 54A-54B, which are electrically coupled to at least one of electrical traces 40 of printed board 4. In the example of FIG. 2, electrically conductive vias 54A-54B extend through printed board 4 to a plane defined by electrical traces 40, permitting an electrical connection with one of electrical traces 4. In some examples, at least one of electrical vias 54A-B may extend through heat sink 42 and electrically connect to at least one of electrically conductive traces 44 instead of, or in addition to, connecting to at least one of electrically conductive traces 40.

In some cases, electrical component 14 may be configured to be mounted using either through-hole mounting techniques or surface mounting technology techniques, as discussed above. As with electrical component 12, component 14 can be directly connected to printed board 4, or may be a part of package (e.g., a housing or a platform) that is then mechanically connected to printed board 4. For example, electrical component 14 may be a metal electrode leadless face (MELF) electrical component configured to be mounted using surface mounting technology (SMT) techniques, such as surface mounting technology attach pad techniques. A MELF electrical component may have an electrical component positioned within a capped cylindrical body that defines a housing.

Electrically conductive vias 38A-38D are electrically connected to at least one of electrical traces 40 of printed board 4. In some cases, at least one of electrical vias 38A-38D may extend through heat sink 42 and electrically connect to at least one of electrically conductive traces 44 instead of, or in addition to, connecting to at least one of electrically conductive traces 40. Electrically conductive traces 40, 44 may be discrete traces, or conductive layers (also known as conductor layers) of printed board 4. Electrically conductive traces 40, 44 can be used to, for example, electrically connect electrical components of assembly 2 to each other or to another element separate from assembly 2. In the example shown in FIG. 2, electrically conductive traces 40, 44 are each shown as a group of ten conductor layers. In the example, electrically conductive traces 40, 44 are electrically isolated from each other by an electrically nonconductive material of printed board 4.

Electrically conductive traces 40, 44 extend through the electrically nonconductive substrate of printed board 4. Electrically conductive traces 40 are closer to top surface 4A of printed board 4 than bottom surface 4B, and electrically conductive traces 44 are closer to bottom surface 4B of printed board 4 than top surface 4A. However, other locations of electrically conductive traces 40, 44 are contemplated. In the example and configuration shown in FIG. 2, top surface 4A of printed board 4 is the surface having the greatest z-axis position (orthogonal x-y axes shown in FIGS. 1, 3, and 4, and x-z axes shown in FIGS. 2 and 5 for ease of description only) and bottom surface 4B is the surface having the smallest z-axis position. Top surface 4A and bottom surface 4B are located on substantially opposite sides of printed board 4 and face in substantially opposite directions. Although two groups of ten electrically conductive traces 40, 44 are shown in FIG. 2, printed board 4 can include any suitable number of electrically conductive traces.

Thermal vias 46A, 46B, 56A, 56B are comprised of a thermally conductive material. Thermal vias 46A, 46B, 56A, 56B are thermally coupled to heat sink 42 of printed board 4. Thermal vias 46A, 46B, 56A, 56B are thermally connected to thermal heat sink 42 but are electrically isolated from electrical traces 40 and 44 disposed in printed board 4 in the example of FIG. 2. In other examples, at least some of thermal vias 46A, 46B, 56A, 56B can be electrically connected to electrical traces 40 and 44 of printed board 4 instead of or in addition to being electrically connected to heat sink 42. In this way, in some examples, electrically conductor layers of printed board 4 in which electrical traces 40 and 44 are defined can be a heat sink instead of or in addition to dedicated heat sink 42.

In the example shown in FIG. 2, thermal vias 46A, 46B, 56A, 56B extend between top surface 4A of printed board 4 and heat sink 42 and extend through printed board 4 in a substantially z-axis direction. In this way, thermal vias 46A, 46B, 56A, 56B define a thermally conductive pathway between thermal attach pads at top surface 4A of printed board 4 and heat sink 42, such that heat can be transferred away from top surface 4A via heat sink 42.

Heat sink 42 is in a plane substantially parallel to top surface 4A of printed board 4, whereby electrical components 12, 14 are positioned on top surface 4A of printed board. Heat sink 42 can be any suitable feature that absorbs and dissipates heat from electrical components 12, 14, and, in some examples, from printed board 4. Heat sink 42 can be located in any position suitable for transferring heat away from electrical components 12, 14. The specific geometry, orientation, or location of heat sink 42 may depend on one or more factors, including, for example, the specific selection and arrangement of thermal management features (e.g., thermal bridges 10, 11 and/or thermal interface material), the thermal conductivities of various materials, and specific type of electrical components 12, 14 employed.

As examples, heat sink 42 may comprise one or more conductive layers of printed board 4, or one or more bonded surface layers proximate to top surface 4A of printed board 4. Heat sink 42 may be integral to printed board 4, separate from printed board 4, or may include a combination of features that are both integral to and separate from printed board 4. Heat sink 42 may also reside on a surface plane of printed board 4. For example, heat sink 42 may reside on at least a portion of top surface 4A of printed board 4. A surface heat sink may be used when thermal attach pads 48, 58 are provided without corresponding thermal vias 46A-B, 56A-B. In this manner, thermal bridges 10, 11 and thermal attach pads 48, 58 can create a dedicated thermal pathway to heat sink 42 without utilizing thermal vias 46A-B, 56A-B.

In some examples, heat sink 42 comprises a thermal conductivity of greater than or equal to approximately 150 Watts/meter-Kelvin, such as greater than or equal to approximately 375 Watts/meter-Kelvin. For example, heat sink 42 can be formed from an alloy of aluminum that exhibits a thermal conductivity of approximately 167 Watts/meter-Kelvin, and/or an alloy of copper that exhibits a thermal conductivity of approximately 385 Watts/meter-Kelvin. Heat sink 42 may be comprised of any suitable material, such as a metal. In some examples, heat sink 42 comprises a thermal core heat sink comprising copper (as shown in the example of FIG. 2), aluminum, or any alloys thereof.

As described above, thermal bridges 10, 11 are positioned to at least partially surround (or "straddle") electrical components 12, 14, respectively, and each define a thermally conductive pathway for transmitting heat away from the respective component 12, 14. In the example shown in FIG. 2, thermal bridge 10 extends substantially entirely around electrical component 12 and is thermally connected to thermal vias 46A, 46B. In this way, thermal bridge 10 defines thermally conductive pathway around the entire outer surface of electrical component 12 not adjacent to printed board 4 (e.g., by surrounding the entire outer surface of housing 30, in which component 12 is disposed). Thermal interface material 50 is disposed between electrical component 12 and first thermal bridge 10. In addition, thermal bridge 11 extends substantially entirely around electrical component 14 and is thermally connected to thermal vias 56A, 56B. In this way, thermal bridge 11 defines thermally conductive pathway around the entire outer surface of electrical component 14 not adjacent to printed board 4. Thermal interface material 60 is disposed between electrical component 14 and second thermal bridge 11. In the example shown in FIG. 2, thermal interface material 60 is disposed between an outer surface of electrical component 14 and an inner surface of second thermal bridge 11.

Thermal bridges 10 and 11 thermally couple to electrical components 12 and 14 to conduct heat away from electrical components 12 and 14. Accordingly, thermal bridges 10, 11 are each comprised of one or more thermally conductive materials. In some examples, thermal bridges 10, 11 are each comprised of a solderable material. For example, thermal bridges 10, 11 may include copper, copper alloys, tin plated steel, tin plated copper, nickel plated copper, and combinations thereof. As described in greater detail below, thermal attach pads 48 and 58 may thermally and/or mechanically connect thermal bridges 10 and 11, respectively, to printed board 4.

The dimensions of thermal bridge 10, 11 can vary depending on various factors, such as the size of the electrical component surrounded, the geometry of bridge selected, and the thermal conductivity of the thermal bridge and/or thermal interface material (TIM) selected. In some cases, however, the thermal bridges 10, 11 each have a minimum wall thickness T of approximately 500 micrometers (approximately 0.020 inches). Wall thickness T of thermal bridges 10, 11 defines the dimension of thermal bridge 10, 11 between an outer surface of the thermal bridge 10, 11 and the inner surface, whereby the inner surface faces electrical component 12, 14, respectively. Wall thickness T can be substantially constant or can vary.

As illustrated in FIG. 2, thermal bridge 10 surrounds both side surface 13 and top surface 15 of electrical component 12. Also, thermal bridge 11 surrounds both side surface 19 and top surface 21 of electrical device 14. In the example of assembly 2 shown in FIGS. 1 and 2, thermal bridges 10, 11 each have a generally U-shape in cross-section, such that thermal bridges 10, 11 can each surround at least a portion of the side surfaces and top surfaces of the respective electrical components 12, 14.

In some examples, a thermal bridge may surround only a side surface or only a portion of a side surface of an electrical component. This type of thermal bridge can be referred to as a truncated thermal bridge. In other examples, a truncated thermal bridge can surround only a top surface or only a portion of a top surface of an electrical component. For instance, a truncated thermal bridge may be elevated on a support member that is positioned between printed board 4 and the thermal bridge. In yet other examples, a thermal bridge may surround at least a portion of a side surface and at least a portion of a top surface of an electrical component. In addition, thermal bridges 10, 11 can surround substantially the entire outer perimeter of the respective electrical component 12, 14 to substantially enclose the electrical component, 12, 14, or may only surround part of the outer perimeter of the respective electrical component 12, 14. Increasing the interfacial surface area between electrical components 12, 14 and respective thermal bridges 10, 11 can increase the amount of heat that thermal bridges 10, 11 transfer away from electrical components 12, 14, respectively.

In the example shown in FIG. 2, thermal bridge 10 surrounds substantially all outer surfaces (e.g., top and side surfaces) of housing 30 and lid 32 that are exposed when housing 30 is attached to printed board 4. That is, thermal bridge 10 substantially surrounds lid 32 and portions of housing 30 that do not face printed board 4, such as the bottom surface of housing 30. Similarly, thermal bridge 11 substantially surrounds electrical component 14, and, in particular, side surfaces 19 and top surface 21 of electrical component 14, which has a substantially quadrilateral cross-sectional shape when the cross-section is taken in the x-y plane. However, in some examples, thermal bridge 11 may surround only one, two, or three side surfaces 19 of electrical component 14. In addition, in examples in which electrical component 14 does not have a substantially quadrilateral cross-sectional shape when the cross-section is taken in the x-y plane, thermal bridge 11 can surround any portion of the outer surface of electrical component 14. For example, thermal bridge 11 can leave ends (e.g., as defined by part of the side surface) of component 14 uncovered by thermal bridge 11.

In some cases, one or more sides of electrical components 12, 14 not surrounded by thermal bridge 10, 11, respectively, may be at least partially covered by thermal interface material (TIM) 50, 60, respectively, or a fillet of thermal interface material (TIM). A thermal bridge may surround at least a portion of an electrical component using any general shape. For instance, bridge material may be V-shaped, Y-shaped, or even a rounded shape in cross-section, rather than substantially U-shaped as shown in FIG. 2, and may surround all or part of the side surfaces of an electrical component.

Thermal bridges 10 and 11 illustrated in FIG. 2 are thermally coupled to thermal attach pads 48, 58, which are comprised of a thermally conductive material and define a thermally conductive pathway away from electrical components 12,14. In the example shown in FIG. 2, thermal attach pads 48, 58 are thermally connected to at least one of thermal vias 46A, 46B, 56A, and 56B. As discussed above, thermal vias 46A, 46B, 56A, and 56B extend at least partially through printed board 4 and are thermally coupled to thermal heat sink 42. Thermal attach pads 48, 58, thermal vias 46A, 46B, 56A, and 56B, or a combination of thermal attach pads and thermal vias can provide thermally conductive pathways through which heat generated by electrical components 12, 14 can be transferred to thermal heat sink 42. In other examples, thermal attach pads 48, 58 can be directly thermally connected to heat sink 42, e.g., if heat sink 42 is positioned on top surface 4A of printed board 4.

In the example shown in FIG. 2, thermal attach pads 48, 58 are electrically isolated (i.e., not in direct electrical communication) from electrical attach pads and from electrical traces 40 and 44 of printed board 4. Also, thermal vias 46A, 46B, 56A, and 56B are electrically isolated from electrical attach pads and from electrical traces 40 and 44 of printed board 4. In this arrangement, thermal management features may help transfer heat away from electrical components 12 and 14 without increasing the impedance or capacitance of electrical connections of assembly 2. However, in some examples, thermal attach pads 48, 58 can be thermally connected to an electrically conductive layer of printed board 4 that also defines one or more of the traces 40, 44. In these examples, the electrically conductive layer can act as both an electrically conductive trace and a heat sink for printed board 4.

In conventional techniques for thermal management of electrical components of a printed board assembly, electrical pathways of the assembly (e.g., electrical attach pads, traces and vias of the printed board) are used to conduct heat away from an electrical component. For example, designers have increased the width and length of electrical traces of a printed board in order to improve the thermal conductivity of the electrical traces. While the enlarged electrical traces can improve heat conduction away from an electrical component, enlarged electrical traces can increase the capacitance of the trace. In contrast to the existing thermal management features of a printed board assembly, assembly 2 includes thermally conductive attach pads 48, 58 and heat sink 42 that are dedicated to conducting heat away from electrical components 12, 14. Thermal vias 46A, 46B, 56A, and 56B are also provided in the illustrated example of FIG. 2 to enhance thermal conduction away from electrical components 12, 14 and to thermally connect thermal attach pads 48, 58 to thermal core heat sink 42. The thermal management features in assembly 2 are separate from electrical attach pads, traces 40, 44, and electrically conductive vias of printed board 4. The dedicated thermally conductive attach pads 48, 58 and thermal vias 46A, 46B, 56A, and 56B can be used in addition to or instead of electrically conductive attach pads, electrically conductive vias 38A-38D, 54A, and 54B, and electrically conducive traces 40, 44 of printed board 4 to transfer heat away from electrical components 12, 14.

By defining dedicated thermal pathways, the thermal management features of assembly 2 can help manage heat generated by electrical components 12, 14 without substantially degrading the electrical performance of assembly 2 by, for example, increasing capacitance within the assembly. By contrast, in some additional examples, one or more thermal management features of assembly 2 may be electrically connected to electrically conductive pathways within assembly 2 without significantly impacting the electrical performance of electrical components 12, 14. For example, some types of electrical components exhibit improved electrical performance in a high capacitance environment. In these situations, thermal bridges 10, 11, thermal attach pads 48, 58, at least one of thermal vias 46A, 46B, 56A, 56B (if included in printed board 4), heat sink electrical component 12, or a combination of these features may be electrically connected in assembly 2. Electrical connectivity may occur through any electrical feature or combination of electrical features, including electrical attach pads, electrical vias 38A-38D, 54A-54B, or electrical traces 40, 44.

Thermal vias 46A, 46B, 56A, and 56B may extend entirely through a thickness of printed board 4 (whereby a thickness is measured in a z-axis direction) or through only a portion of printed board 4. For example, thermal vias 46A, 46B, 56A, and 56B may truncate at thermal heat sink 42, before reaching electrical traces 44. In additional examples, one or more of a plurality of thermal vias may extend different lengths through printed board 4. For instance, a first thermal via may extend to a first thermal heat sink on a first thermal plane of printed board 4 and a second thermal via may extent to a second thermal heat sink on a second thermal plane of printed board 4.

As described in greater detail below, thermal vias 46A, 46B, 56A, and 56B may be at least partially defined by an attach pad used to mechanically couple thermal bridges 10, 11 to board 4. Thermal vias 46A, 46B, 56A, and 56B may be filled or unfilled and may include thermally conductive materials. For example, thermal vias 46A, 46B, 56A, and 56B may include copper and copper alloys. In some cases, thermal vias 46A, 46B, 56A, and 56B can each be formed by defining openings in printed board 4 and filling the openings with a thermally conductive material, such as a conductive epoxy. As a particular example, thermal vias 46A, 46B, 56A, and 56B can be formed by drilling and copper plating holes in printed board 4. A thermally conductive material may then be introduced into the copper plated holes to provide additional thermal conductivity. In further cases, for example where thermal vias 46A, 46B, 56A, and/or 56B are separate from an attach pad, the thermal via can be defined by an opening within the printed board 4 that remains unfilled. For example, one or more thermal vias may be drilled, plated with a thermally conductive material such as copper. The thermal vias can be left unfilled, allowing thermally conductive plating in the unfilled vias to help conduct heat from thermal bridge 10, 11 to thermal heat sink 42.

In some examples, thermal bridges 10, 11 may directly contact outer surfaces of electrical component 12 (or housing 30) and electrical component 14 (or a housing of the component). However, in the example shown in FIG. 2, thermal bridge 10 is configured such that once it is positioned around housing 30, there is a gap between housing 30 and bridge 10. Similarly, thermal bridge 11 is configured such that once it is positioned around electrical component 14, there is a gap between the outer surface of component 14 and bridge 11. The gaps between components 12 (or housing 30), 14 and the respective bridges 10, 11 can be useful to provide electrical isolation between the electrical component and thermal bridge, to allow for manufacturing and assembly tolerances, and to accommodate expansion and contraction of bridges 10, 11 and components 12, 14, which can have different coefficients of thermal expansion. In some examples, gaps G are in a range of approximately 500 micrometers (approximately 0.020 inches) to approximately 1.25 millimeters (approximately 0.050 inches). Gaps G can be the same or different for thermal bridges 10, 11. In addition, for each of thermal bridges 10, 11, gap G between the thermal bridge and respective electrical component can be substantially constant or may vary.

While the gaps between components 12 (or housing 30), 14 and the respective bridges 10, 11 can remain unoccupied, in some examples, assembly 2 includes thermal interface material (TIM) 50, 60 in at least a portion of the gaps. In the example shown in FIG. 2, assembly 2 includes thermal interface material 50 disposed between electrical component 12 and thermal bridge 10, and thermal interface material 60 disposed between electrical component 14 and thermal bridge 11. In the example shown in FIG. 2, thermal interface material 50 is disposed between an outer surface of electrical component 12 and an inner surface of thermal bridge 10, and thermal interface material 60 is disposed between an outer surface of electrical component 14 and an inner surface of thermal bridge 11.

Thermal interface material 50, 60 is positioned to define a thermally conductive pathway between electrical components 12, 14, respectively, and the respective thermal bridges 10, 11. In examples in which there is an unoccupied space between electrical components 12, 14 and their respective thermal bridges 10, 11, thermal interface material 50, 60 at least partially fills the gap between electrical components 12 and 14 and thermal bridges 10 and 11, respectively. In some examples, thermal interface material 50, 60 completely fills the space between electrical components 12 and 14 and thermal bridges 10 and 11, respectively, while in other examples, thermal interface material 50, 60 partially fills the space between electrical components 12 and 14 and thermal bridges 10 and 11, respectively.

Thermal interface material 50, 60 can comprise any suitable thermally conductive material. In some cases, thermal interface material 50, 60 has a relatively high thermal conductivity while being electrically insulative. For example, thermal interface material 50, 60 can have a thermal conductivity greater than approximately 5 Watts/meter-Kelvin, such as greater than approximately 10 Watts/meter-Kelvin, or greater than approximately 12.5 Watts/meter-Kelvin in some examples. Other thermal conductivity values are also contemplated. In this manner, thermal interface material (TIM)

50, 60 provides a relatively low impedance thermal pathway between electrical components 12 and 14 and thermal bridges 10 and 11, respectively. In general, any type of thermal interface material is suitable for use in assembly 2. Specific examples of thermal interface materials include silicone-based adhesives and diamond-filled thermal interface materials (TIM). One suitable thermal interface material is a diamond-filled ME7159 TIM, available from AI Technology Inc. of Princeton Junction, N.J., which has a thermal conductivity of approximately 10.4 Watts/meter-Kelvin. Thermal interface material (TIM) 50 may be the same as thermal interface material (TIM) 60. Thermal interface material (TIM) 50 may also be different than thermal interface material (TIM) 60. A specific type of thermal interface material (TIM) can be selected based on the type of electrical component used and desired heat transfer rates.

Thermal interface material 50 and 60 may be introduced adjacent electrical components 12 and 14 before or after thermal bridges 10 and 11 are added to assembly 2. For example, thermal interface material 50 may be applied to at least a portion of side surface 13 or top surface 15 of electrical component 12. Alternatively, thermal interface material 50 may be applied to at least a portion of housing 30 or housing lid 32. Afterwards, thermal bridge 10 may be placed over electrical component 12. As another example, thermal interface material 60 can be applied to at least a portion of outer surfaces 19, 21 of electrical component 14 prior to the coupling of thermal bridge 11 to printed board 4. In some cases, thermal interface material 50, 60 can be introduced between thermal bridges 10, 11 and the respective electrical components 12, 14 after thermal bridges 10, 11 are placed on printed board 4 over the respective electrical components 12, 14. For example, thermal interface material 50, 60 may be introduced after electrical components 12, 14 and thermal bridges 10, 11 are solder reflow attached and cleaned. In examples in which one or both thermal bridges 10, 11 do not surround the entire outer surface of the respective electrical component 12, 14, thermal interface material 50, 60 can be introduced through any openings in the thermal bridge.

As another example, thermal bridges 10 and 11 may define one or more fill ports 16, 18 that can be used as an access point for introducing thermal interface material between thermal bridges 10, 11 and the respective electrical components 12, 14. Fill ports may be slots, gaps, holes, or other openings that allow a thermal interface material to be introduced into the space between thermal bridges 10, 11 and electrical components 12, 14, respectively. In the example shown in FIG. 2, thermal bridge 10 includes two fill ports 16. Thermal bridge 11 includes a single fill port 18. Thermal bridge 10 may be placed over at least a portion of side surface 13 or top surface 15 of electrical component 12. Also, thermal bridge 11 may be placed over at least a portion of side surface 19 or top surface 21 of electrical component 14.

After placement of electrical component and thermal bridge on printed board 4, for example, by solder reflow attachment, thermal interface material 50 and 60 may be introduced through fill ports 16 and 18, respectively, so thermal interface material 50 and 60 is disposed between electrical components 12 and 14 and thermal bridges 10 and 11. In some examples, as shown in FIG. 2, thermal interface material (TIM) 50, 60 can also be positioned between electrical components 12, 14, respectively, and printed board 4. In other examples, thermal bridges 10, 11 can include any suitable number of fill ports, which can be selected based on, for example, the size of the thermal bridges 10, 11 and the volume of thermal material introduced between the thermal bridge and respective electrical component.

As noted above, electrical components 12 and 14 may be attached to printed board 4 using any suitable fixation technique, such as solder, an adhesive or another fixation mechanism (e.g., a bolt or screw). In addition, thermal bridges 10, 11 can be thermally coupled to the respective thermal vias 46A, 46B, 56A, 56B using any suitable technique, such as thermal attach pads 48, 58 that are in thermal communication with the thermal vias and thermal bridges.

In some examples, printed board 4 may include electrical attach pads to electrically connect electrical components 12, 14, and thermal attach pads that are thermally connected to a heat sink. When both electrical attach pads and thermal attach pads are provided, the different attach pads can be arranged in an suitable configuration based, for example, the size and positioning of electrical components 12, 14, and surface area of printed board 4. Thermal attach pads and electrical attach pads may be adjacently located and, in cases, may even be abutting. In further cases, thermal attach pads and electrical attach may be removed from one another. For example, a thermal attach pad may be separated from the nearest electrical attach pad by greater than approximately 1 millimeter, such as greater than approximately 1 centimeter, or greater than approximately 5 centimeters.

As an example, FIG. 3 is a schematic plan view of combination electrical component and thermal bridge attach pad footprints 76, 78, which can be different areas of printed board 4. Attach pad footprints 76, 78 illustrate an example arrangement of electrical component attach pads 80, 92 for mounting electrical components 12, 14 to printed board 4 and thermal attach pads 82, 94 for mounting thermal bridges 10, 11, respectively, to printed board 4. In the example shown in FIG. 3, attach pads 80, 82, 92, and 94 are shown as dashed lines to indicate that the attach pads are defined as a recess in footprints 76, 78. For example, a recessed pad may be an aperture within a solder mask area. In some examples, one or more of attach pads 80, 82, 92, and 94 may be even with a plane defined by attach pad footprints 76, 78, or may even extend above the plane defined by attach pad footprints 76, 78.

Attach pads 80, 82, 92, 94 can be comprised of any suitable material, such as tin-lead, silver or gold plated copper. In general, at least one of thermal attach pads 80, 92 may include a thermally conductive material, such as copper or a copper alloy, to facilitate thermal conduction between the at least one thermal attach pad and a heat sink. Similarly, at least one of electrical attach pads 82, 94 may include an electrically conductive material to facilitate electrical conduction between the at least one electrical attach pad and an electrically conductive trace disposed in printed board 4. Attach pads 80, 82, 92, 94 may be used, for example, with surface mounting technology (SMT) techniques for mounting thermal bridges 10, 11 and electrical components 12, 14 to printed board 4. Attach pads 80, 82, 92, 94 are disposed at the top surface 4A (FIG. 2) of printed board 4 and can provide surface to which thermal bridges 10, 11 and electrical components 12 and 14 can be reflow solder attached.

In the example of FIG. 3, electrical attach pads 80 define solder attachment locations on combination footprint 76 for electrical component 12. Thermal attach pads 82 define solder attachment locations on combination footprint 76 for thermal bridge 10. As shown in FIG. 3, combination footprint 76 includes electrical vias 84 and/or 88 that are electrically connected to electrical attach pads 80 and one or more conductive traces (e.g., traces 40 shown in FIG. 2), and thermal vias 86 and/or 90 that are thermally coupled to thermal attach pads 82 and to a heat sink (e.g., heat sink 42 shown in FIG. 2). In some examples, combination footprint 76 may include only in-pad vias 84 and 86, or only out-of-pad vias 88 and 90, although FIG. 3 illustrates both in-pad and out-of-pad vias. Electrical vias 84 and/or 88 are electrically conductive and can each be, for example, a blind hole via that extends partially through printed board 4 in a z-axis direction (orthogonal x-y axes are shown in FIG. 3 for ease of description). Electrical vias 84 can be, for example, similar to electrical vias 38A-38D shown and described with respect to FIG. 2. For example, electrical vias 84 can be filled vias, as discussed above.

Thermal vias 86 and/or 90 can be, for example, through-hole vias that extend through the entire printed board 4 in the z-axis direction. In other examples, at least one of the electrical vias 84 and/or 88 can be through-hole vias and/or at least one of the thermal vias 86, 90 can be blind vias. In the example shown in FIG. 3, at least some of thermal vias 86 and/or 90 are electrically isolated from electrical vias 84 and/or 88, such that the thermal vias define a dedicated pathway for conduction of heat away from electrical component 12. Thermal vias 86 and/or 90 can be, for example, similar to thermal vias 46A, 46B shown and described with respect to FIG. 2. In cases, one or more thermal vias 86 may be a filled via while one or more thermal via 90 may be an unfilled via.

In the example shown in FIG. 3, electrical vias 84 are located within electrical attach pads 80 and electrically connected to electrical attach pads 80, while thermal vias 86 are located within thermal attach pads 82 and thermally coupled to thermal attach pads 82. Neither thermal vias 86 nor thermal attach pads 82, however, are in direct electrical communication with electrical attach pads 80, and, in some examples, at least some of thermal vias 86 and thermal attach pads 82 are electrically isolated from electrical attach pads 80 and electrical vias 84. In other cases, electrical vias and thermal vias may be located outside of attach pads 80, 82. For example, assembly 2 may include electrical vias 88 and thermal vias 90, which are positioned such that they do not overlap with outside attach pads 80 and 82. Although not located directly in-pad (i.e., in an attach pad), electrical vias 88 are electrically connected to electrical attach pads 80, and thermal vias 90 are thermally connected to thermal attach pads 82 through, for example, peripheral connections not shown in FIG. 3. Electrical vias 84 located within electrical attach pads 80 and thermal vias 86 located within thermal attach pads 82, as opposed to electrical vias 88 and thermal vias 90, may, in some cases, improve electrical and thermal efficiency of printed board assembly 2. As noted, in-pad electrical vias 84 may be filled with electrically conductive material, thereby reducing electrical resistance as compared to electrical via 88, which may be unfilled. Similarly, thermal vias 86 may be filled with thermally conductive material to reduced thermal resistance as compared to thermal vias 90, which may also be unfilled.

In addition, electrical vias 84 and thermal vias 86 that are within the attach areas, e.g., substantially overlap with attach pads 80, 82, respectively, can help reduce a footprint of the electrical component, thereby increasing the density with which electrical components can be placed on printed board 4. However, electrical vias 84 and thermal vias 86 may require filling to prevent the openings defined by electrical vias 84 and thermal vias 86 from wicking solder away from attach pads 80, 82 during manufacturing of assembly 2. By contrast, electrical vias 88 and thermal vias 90, which are located outside of attach pads 80 and 82, can remain unfilled. Unfilled electrical vias 88 and thermal vias 90 may reduce the cost and time required to create printed board 4 compared to examples in which printed board 4 includes filled electrical vias 84 and thermal vias 86.

Combination footprints 76, 78 may be, for example, sections of a common printed board 4. Combination footprint 78 may include features similar to the features of combination footprint 76 discussed above. For example, combination footprint 78 includes solder mask defined electrical attach pads 92 that defines a solder attachment location for electrical component 14. Combination footprint 78 further includes solder mask defined attach pad 94 that defines a solder attachment location for thermal bridge 11. Combination footprint 78 further includes electrical vias 96, or 100 that define electrically conductive pathways from electrical attach pads 92 at top surface 4A (FIG. 2) of printed board 4 to one or more electrically conductive traces of printed board 4. Electrical vias 96 and/or 100 can be, for example, blind hole or through-hole vias. Combination footprint 78 further includes thermal vias 98 and/or 102 that define thermally conductive pathways between thermal attach pads 94 at top surface 4A of printed board 4 and, e.g., heat sink 42 of printed board 4. Electrical vias 96 and/or 100 can be, for example, similar to electrical vias 54A, 54B (FIG. 2).

Thermal vias 98 and/or 102 can also be through-hole or blind hole vias defined through printed board 4. In the example shown in FIG. 3, at least some of thermal vias 98 and/or 102 are electrically isolated from electrical vias 96 and/or 100, such that the thermal vias define a dedicated pathway for conduction of heat away from electrical component 14. Thermal vias 98 and/or 102 can be similar to, for example, thermal vias 56A, 56B (FIG. 2).

Electrical vias 96 are directly electrically connected to electrical attach pads 92, and thermal vias 98 are in direct thermal connection with thermal attach pads 94. In other cases, electrical vias and thermal vias may be located outside of attach pads 92 and 94, such that the vias are not in either direct electrical or direct thermal connection with solder pads 92, 94. For example, assembly 2 can include electrical vias 100 and thermal vias 102 located outside of attach pads 92 and 94.

Using a process described in greater detail below, electrical attach pads 80, 92 may be used to reflow attach electrical components 12 and 14, respectively, to printed board 4. FIG. 4 is a schematic plan view of electrical components 12, 14 mounted on respective attach pads 80, 92. As discussed with respect to FIG. 2, electrical component 12 is enclosed in housing 30 that includes lid 32. Housing 30 may be configured to mount directly to conductive patterns on printed board 4 using surface mount technology techniques and solder pad 80. In the plan view of FIG. 4, lid 32 is shown. Housing 30 and lid 32 are positioned on combination footprint 76 such that housing 30 does not substantially overlap with thermal attach pads 82 to which thermal bridge 10 is configured to connect.

As FIG. 4 illustrates, electrical component 14 is positioned on electrical attach pads 92 such that electrical component 14 does not substantially overlap with thermal attach pads 94 to which thermal bridge 11 is configured to mechanically attach. Although not shown in FIG. 4, in some examples, electrical component 14 may also include a package housing. For example, electrical component 14 may be a metal electrode leadless face (MELF) electrical component that includes an electrical component positioned within a capped cylindrical body. The metal electrode leadless face electrical component may be configured to be mounted using surface mounting technology techniques.

After positioning electrical components 12 and 14 over printed board 4 using electrical attach pads 80, 92, respectively, thermal bridges 10 and 11 may be positioned over at least a portion of electrical components 12, 14, respectively, and aligned at least partially over respective thermal attach pads 82, 94. Electrical components 12, 14 and thermal bridges 10, 11 can then be mechanically attached to attach pads 80, 92 and 82, 94, respectively, using a solder reflow technique. A cleaning operation may follow reflow attachment to, for example, remove flux residue. If desired, thermal interface material (TIM) 50 (FIG. 2) can be introduced between thermal bridge 10 and electrical component 12 before or after thermal bridge 10 is attached to thermal attach pad 82, and thermal interface material (TIM) 60 can be introduced between thermal bridge 11 and electrical component 14 before or after thermal bridge 11 is attached to thermal attach pad 94.

Attach pads 80, 82, 92, 94 are one example of a configuration of attach pads on printed board 4 and are not intended to limit to scope of assembly 2. The number, size, positioning, and configuration of attach pads may vary depending on the specific electrical components to be attached, the packaging of the electrical components, and the design of the printed board arrangement. For example, in some examples, electrical components 12, 14 and/or thermal bridges 10, 11 may not be located on top of attach pads 80, 82, 92, and 94, but instead one or more of the attach pads may be in a peripheral area near electrical components 12, 14 and/or thermal bridges 10, 11. In this configuration, electrical components 12, 14 and/or thermal bridge 10, 11 may connect to the peripheral attach pads using, for example, peripheral leads. As another example, attach pads may be reduced in size if there are no electrical or thermal via, or if electrical or thermal vias are located outside of are defined by attach pads 80, 82, 92, or 94. As another example, electrical components may be attached to printed board 4 using, for example, an adhesive. For example, an electrically conductive adhesive may be used to electrically and/or mechanically connect electrical components 12, 14 to printed board 4, while a thermally conductive adhesive may be used to thermally and/or mechanically connect thermal bridges 10, 11 to printed board 4. In some cases, an adhesive may be both electrically and thermally conductive.

Figure 5:
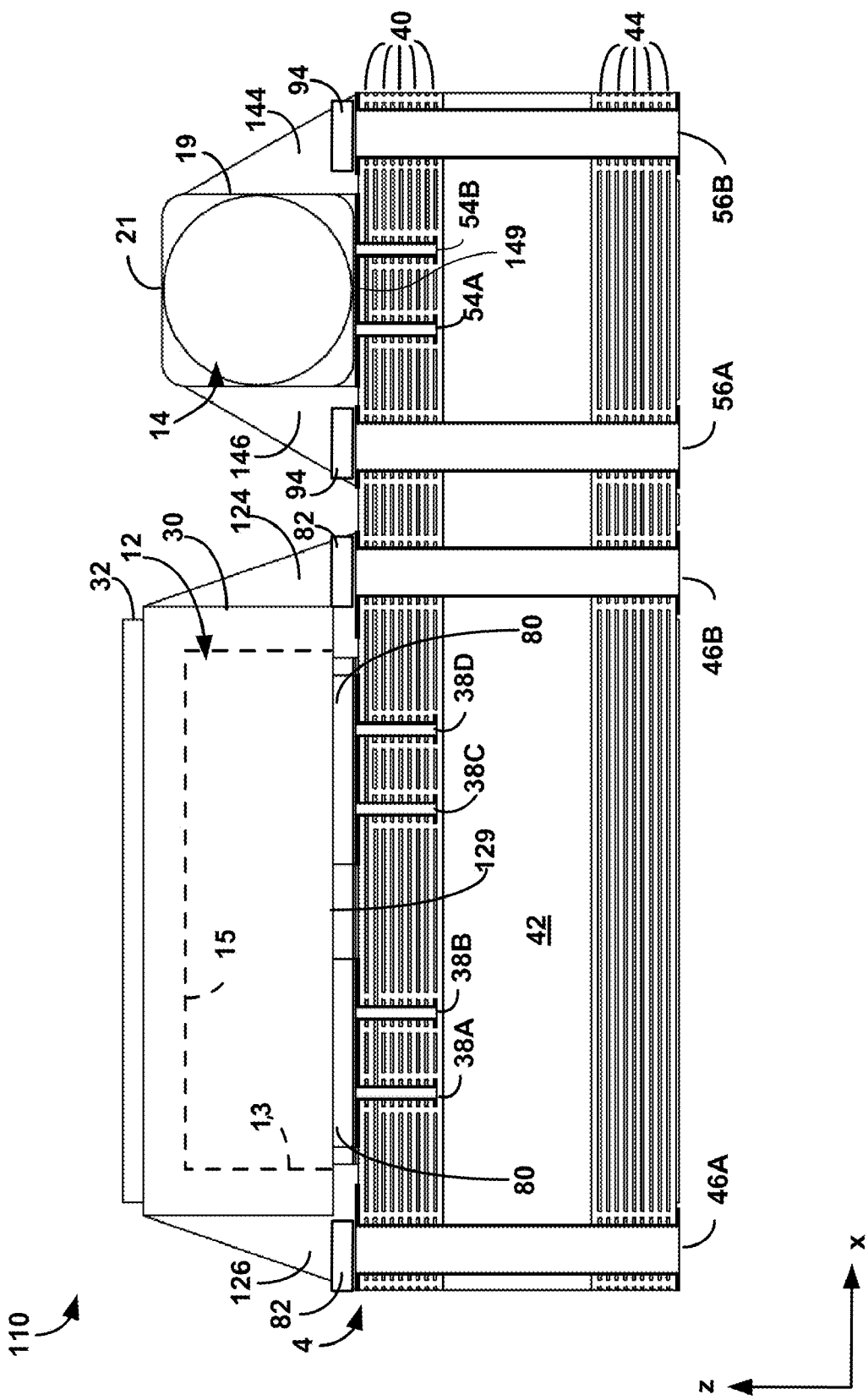
FIG. 5 is a schematic cross-sectional view of another example assembly that includes one or more thermal management features.

In the examples illustrated in FIGS. 2-4, thermal vias 46A, 46B, 56A, 56B are show as discrete, substantially cylindrical vias that extend from combination footprints 76, 78 into printed board 4. The assemblies of this disclosure, however, may use a single thermally conductive thermal via or a plurality of thermally conductive thermal vias. A thermal via may be discrete, as illustrated, or may be integrated into a thermal bridge to form a unitary component. In some cases, a thermal via may be continuous and substantially coextensive with a length of thermal bridge disposed on a printed board. In additional cases, a thermal via may change shape or cross-sectional area across a direction of a printed board. The dimensions of a thermal via will vary depending on a selected geometry of the thermal via. In general, the specific shape or dimensions of a thermal via may not be critical as long as the thermal via is thermally conductive. In some examples, at least one thermal via is electrically isolated from electrical attach pads, electrical vias, and traces in a printed board While thermal bridges can be useful for defining a thermally conductive path between an electrical component and heat sink 42 of printed board 4, in some examples, an assembly can include a thermally conductive path between an electrical component and heat sink 42 that does not include a common thermal bridge that straddles at least two sides of an electrical component (directly or indirectly via a housing). FIG. 5 is a cross-sectional view of an example assembly 110 that includes thermal management features for managing the heat generated by electrical components, where the thermal management features do not include a thermal bridge. However, assembly 110 can also include a thermal bridge in other examples.

As with assembly 2 (FIGS. 1 and 2), electrical components 12 and 14 are mounted to printed board 4. Printed board 4 includes electrically conductive electrical attach pads 80 and electrical attach pads 92 (not shown in FIG. 5), electrically conductive electrical vias 38A-38D, 54A, and 54B, and electrically conductive traces 40, 44. Printed board 4 also includes thermally conductive thermal attach pads 82, 94 and thermally conductive thermal vias 46A, 46B, 56A, and 56B that extend through printed board 4. Thermally conductive attach pads 82, 94 may, in some examples, be more thermally conductive than electrically conductive electrical attach pads 80. In addition, electrically conductive electrical attach pads 80 may, in some examples, be more electrically conductive than thermally conductive attach pads 82, 94.

Thermal attach pads 82, 94 are thermally connected to heat sink 42 via thermal vias 46A, 46B, 56A, and 56B. In the example of FIG. 5, thermal attach pads 82, 94 are electrically isolated from electrical attach pads 80, 92, electrical vias 38A-38D, 54A, and 54B, and electrical traces 40, 44 disposed in printed board 4. However, as discussed, in some examples one or more of thermal attach pads 82, 94 may be thermally connected to one or more of the electrical features of printed board 4. Assembly 110 further includes thermal interface material (TIM) 124 and 126, which are disposed adjacent electrical component 12 and thermal attach pads 82. Assembly 110 also includes thermal interface material 144 and 146, which are disposed adjacent electrical component 14 and thermal attach pads 94.

Assembly 110 is similar to assembly 2 shown in FIGS. 1 and 2. However, rather than including thermal bridges 10, 11 that at least partially surround electrical components 12, 14, respectively, to help transfer heat away from at least side surfaces of electrical components 12, 14, thermal interface material 124, 126, 144, 146 is positioned to help transfer heat away from electrical components 12, 14. In particular, thermal interface material 124, 126 is positioned to at least partially surround electrical component 12 (and, in the example shown in FIG. 5, housing 30) and thermal interface material 144, 146 is positioned to at least partially surround electrical component 14. Thermal interface material 124, 126 is thermally connected to at least a portion of one of the thermal attach pads 82. Further, thermal attach pads 82 are thermally connected to heat sink 42 via thermal vias 46A, 46B. Together, these features defined a thermally conductive path between electrical component 12 and heat sink 42. Similarly, thermal interface material 144, 146 is thermally connected to at least a portion of thermal attach pads 94 that are thermally connected to heat sink 42 via thermal vias 54A, 54B. In some examples, the thermally conductive paths are electrically isolated from traces 40, 44 and, in some examples, all electrically conductive layers of printed board 4.

Thermal interface material 124, 126, 144, 146 can be comprised of material similar to thermal interface material 50, 60 described above with respect to FIG. 2. In addition, sections of thermal interface material 124, 126, 144, 146 can be comprised of the same or different thermally conductive materials, and each section of thermal interface material 124, 126, 144, 146 can comprise one or more layers of thermally conductive material. Thermal interface material may disposed adjacent at least a portion of a top surface, at least a portion of a side surface, or at least portion of both a top surface and a side surface of an electrical component. In some cases, a plurality of thermal interface materials may be disposed adjacent a single electrical component and a thermal attach pad.

Regardless of the technique used to apply thermal interface materials 124, 126, 144, 146 to printed board 4, thermal interface materials 124, 126, 144, 146 are positioned adjacent an electrical component and printed board 4 such that they provide a thermal path between the electrical component and one or more thermal attach pads of printed board 4.

Thermal interface material 124, 126 can be positioned to contact any suitable surface area of electrical component 12. As discussed above, increasing the surface area from which heat is transferred away from an electrical component can improve the rate at which heat can be transferred away from component 12, which, in some cases, can improve electrical performance of the component 12. Thus, it may be desirable for thermal interface material 124, 126 to contact at least the entire side surface of housing 30, and, in some examples, regions of housing 30 and lid 32 adjacent to top surface 15 of component 12.

In the example shown in FIG. 5, sections of thermal interface material 124, 126 are disposed adjacent side surface 13 of electrical component 12 on substantially opposite sides of component 12. In particular, in the example shown in FIG. 5, thermal interface material 124, 126 is in direct contact with housing 30, through which heat generated by electrical component 12 dissipates. Thermal interface material can be disposed adjacent to more than one side of component 12 (if electrical component 12 defines discrete side surfaces) and can be substantially continuous around at least a portion of an outer perimeter of component 12 or arranged as discrete sections of thermal interface material that do not define a substantially continuous surface.

Thermal interface material (TIM) 124 is thermally coupled to thermal pad 82 and thermal via 46B, and thermal interface 126 is thermally coupled to thermal pad 82 and thermal via 46A. In this way, thermal interface material 124, 126 defines a thermally conductive path from electrical component 12 to heat sink 42. Thermal interface material (TIM) 124, 126 comprise a fillet shape in the example shown in FIG. 5. However, thermal interface material 124, 126 can be deposited to have any suitable shape.

Sections of thermal interface material (TIM) 144, 146 are disposed adjacent side surface 19 of electrical component 14. Thermal interface material 144, 146 can be positioned to contact any suitable surface area of electrical component 14. In order to increase the surface area from which heat can be transferred away from electrical component 14, it may be desirable for thermal interface material 144, 146 to contact at least the entire side surface 19 of component 14, and, in some examples, at least a portion of or the entire top surface 21 of component 14.

In the example shown in FIG. 5, sections of thermal interface material 144, 146 are disposed adjacent side surface 19 of electrical component 14 on substantially opposite sides of component 14. In particular, in the example shown in FIG. 5, thermal interface material 124, 126 is in direct contact with component 14. Thermal interface material can be disposed adjacent to more than one sides of component 14 (if electrical component 14 defines discrete side surfaces) and can be substantially continuous around at least a portion of an outer perimeter of component 14 or arranged as discrete sections of thermal interface material that do not define a substantially continuous surface.

Thermal interface material (TIM) 144 is thermally coupled to thermal pad 94 and thermal via 56B, and thermal interface material (TIM) 146 is thermally coupled to thermal pad 94 and thermal via 56A. In this way, thermal interface material 144, 146 defines a thermally conductive path from electrical component 14 to heat sink 42. Thermal interface material 144, 146 comprise a fillet shape in the example shown in FIG. 5. However, thermal interface material 144, 146 can be deposited to have any suitable shape.

In some examples, thermal interface materials (TIM) 124, 126, 144, 146 may also be formed from an electrically insulative material. This can be useful for, for example, prevent shorts between traces 40, 44 or other electrically conductive pathways of assembly 2.

Figure 6:
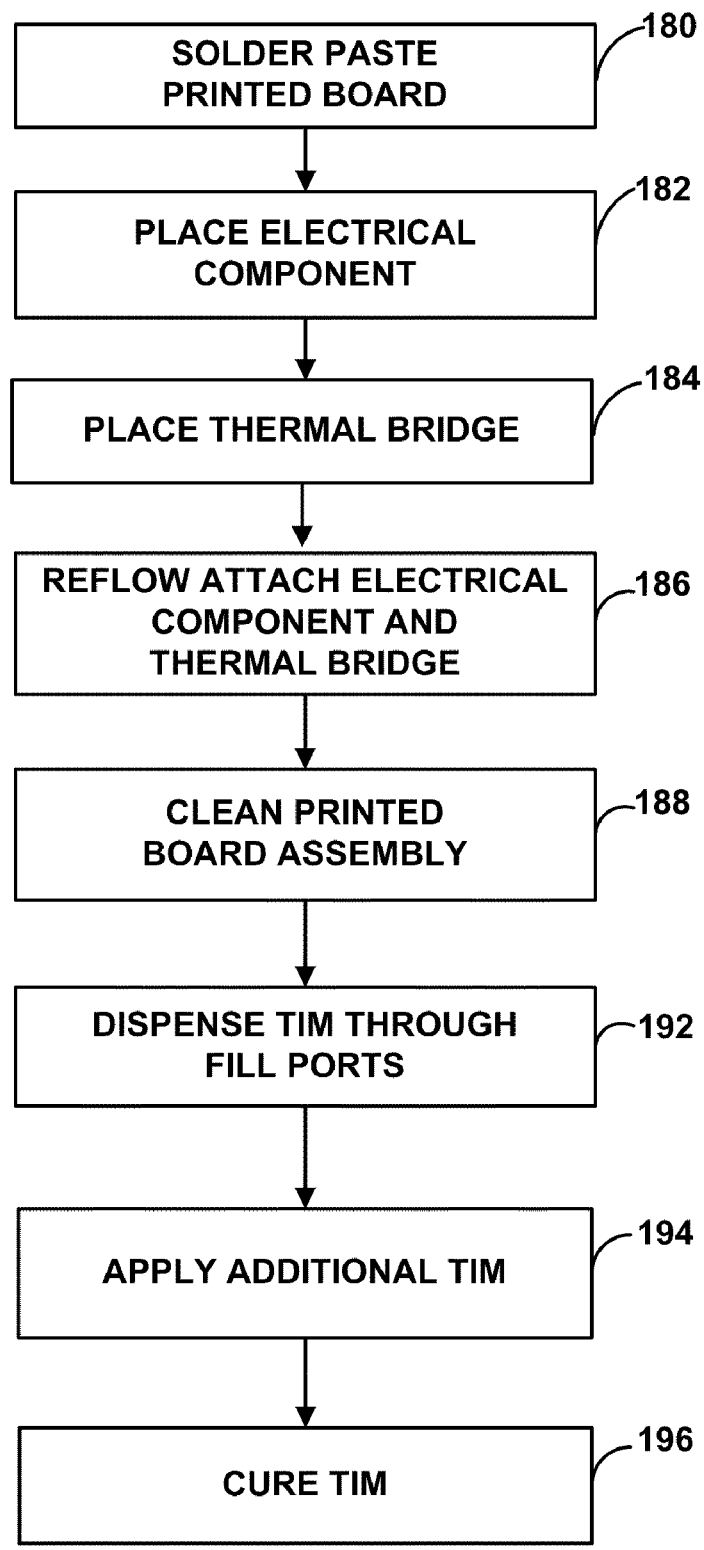
FIG. 6 is a flow diagram illustrating an example technique for forming an assembly with an electrical component, a thermal bridge and a thermal interface material (TIM).

FIG. 6 is a flow diagram illustrating an example technique for forming an assembly that includes an electrical component, a printed board (or another substrate) and one or more thermal management features (e.g., a thermal bridge and/or a thermal interface material). While the technique is described with respect to assembly 2 (FIGS. 1 and 2), in other examples, a similar technique can be used to form assembly 110 (FIG. 5). However, the technique shown in FIG. 6 may be modified such that a thermal bridge is not coupled to a printed board.

According to the example technique, solder paste is applied to printed board 4, e.g., at a plurality of separate attach pads 80, 82, 92, 94 (FIG. 3) (180). The solder paste is deposited and arranged on printed board 4 at attach pads defined by a solder mask. Therefore, discrete sections of the solder paste can be applied over the appropriate electrical vias (e.g., vias 84, 96 shown in FIG. 3) and/or thermal vias (e.g., thermal vias 86, 98 shown in FIG. 3). The appropriate electrical vias and thermal vias for each solder pad can be determined, e.g., based on the known locations for each electrical component and thermal bridge or thermal interface material.

The solder paste may be applied using any suitable technique, such as, for example, a stencil or screen printing process. In some cases, the solder paste may be applied such that it is limited to one or more attach pads on printed board 4. The solder paste may be comprised of any suitable material, such as a paste that includes particles of solder (e.g., a tin-lead alloy).

An electrical component (e.g., component 12 or 14 shown in FIG. 2) is then placed on the solder paste disposed on printed board 4 (182). For example, electrical component 12 can be placed on solder paste at attach pads 80 (FIG. 3) and electrical component 14 can be placed on solder paste at attach pads 92. Any suitable number of electrical components can be attached to printed board 4. The electrical components can be placed using any suitable technique, such as manually or via a computer controlled pick and place robot.

The electrical component may be positioned on printed board 4 to electrically connect to an electrically conductive attach pads. The electrically conductive attach pad may be electrically connected to electrical vias and traces disposed in printed board 4. For example, electrical component 12 can be placed on solder paste at attach pads 80 (FIG. 3), which overlie electrically conductive vias 84 (FIG. 3) that are in electrically conductive contact with one or more electrically conductive traces 40, 44. As another example, electrical component 12 can be placed on solder paste at electrical attach pads 80 (FIG. 3), and positioned such that electrical contacts of component 12 or housing 30 are in electrical communication with (e.g., direct or indirect electrical contact) electrically conductive vias 88, which are in electrical communication with one or more electrically conductive traces 40, 44.

As another example, electrical component 14 can be placed on solder paste at attach pads 92, which overlie electrically conductive vias 96 (FIG. 3) that are in electrically conductive contact with one or more electrically conductive traces 40, 44. In addition or alternatively, electrical component 12 can be placed on solder paste at attach pads 92 (FIG. 3), and positioned such that electrical contacts of component 14 are in electrical communication with (e.g., direct or indirect electrical contact) electrically conductive vias 100, which are in electrical communication with one or more electrically conductive traces 40, 44.

After placing electrical components on printed board 4, one or more thermal bridges are placed on the solder paste disposed on printed board 4 (184). For example, thermal bridge 10 can be placed on printed board 4 in alignment with thermal attach pads 82 (FIG. 3), such that the ends of thermal bridge 10 are at least partially and, in some examples, entirely positioned on thermal attach pads 82. In addition, thermal bridge 11 can be placed on printed board 4 in alignment with thermal attach pads 94, such that the ends of thermal bridge 11 are at least partially, and, in some examples, entirely positioned on thermal attach pads 94. Thermal bridges 10, 11 are positioned on printed board 4 (184) such that thermal bridges 10, 11 surround at least a portion of a side surface of the respective electrical components 12, 14, e.g., as shown in FIG. 2.

Electrical components 12, 14 and thermal bridges 10, 11 are reflow solder attached to printed board 4 (186). For example, printed board 4, along with the electrical components 12, 14, and thermal bridges 10, 11 that have been attached to printed board 4 can be introduced into a reflow oven. The reflow oven may operate at a temperature high enough to melt solder particles in the solder paste at the attach pads, thereby binding the electrical component and thermal bridge to the printed board. Following the reflow attachment of one or more electrical components and one or more thermal bridges to printed board 4, all solder flux or other residues from printed board 4 may be cleaned off using, for example, a chemical solvent (188).

In the technique shown in FIG. 6, a thermal interface material (TIM) is introduced adjacent an electrical component (190). In examples in which a thermal bridge was positioned at least partially around a side surface of the electrical component, the thermal interface material (TIM) can be introduced into a space between an inner surfaces of the thermal bridge and outer surfaces of the electrical component or housing in which the electrical component is positioned. For example, thermal interface material 50 can be introduced through one or both fill ports 16 defined by thermal bridge 10, such that thermal interface material 50 is disposed between thermal bridge 10 and housing 30 of electrical component 12. Utilization of two or more fill ports 16 may be useful if thermal bridge 10 is relatively large. As another example, thermal interface material 60 can be introduced through fill port 18 defined by thermal bridge 11.

The thermal interface material may be introduced through one or more fill holes in the thermal bridge or at a different location, as discussed above. Introduction of the thermal interface material into the space between a thermal bridge and electrical component around which the thermal bridge is placed may be accomplished using any suitable technique. For example, a flowable thermal interface material, such as a liquid, paste, or grease can be introduced into the space between the thermal bridge and respective electrical component via an introduction tool, such as a syringe, pipette, nozzle, or similar apparatus. The introduction tool can introduce a predetermined volume of thermal interface material into the space between a thermal bridge and respective electrical component. In other examples, however, thermal interface material may be introduced into the space between the thermal bridge and respective electrical component until thermal interface material protrudes out of a fill port, out of an end of a thermal bridge where the thermal bridge does not cover a side surface of an electrical component, or out of both locations.

In some examples, additional thermal interface material is applied to one or more electrical components of assembly 2 (194). For example, a fillet of thermal interface material may be attached to a side surface or a top surface of an electronic component not covered by thermal bridge material. In this manner, an electrical component may be entirely encased with thermally conductive material. The thermal interface material adjacent the one or more electrical components may be cured (196). The parameters of curing, as well as the necessity of curing may depend on the type and volume of thermal interface material used. In some cases, curing may include oven curing that heats the thermal interface material to a temperature of at least approximately 150° C. for approximately one hour.

Figure 7:
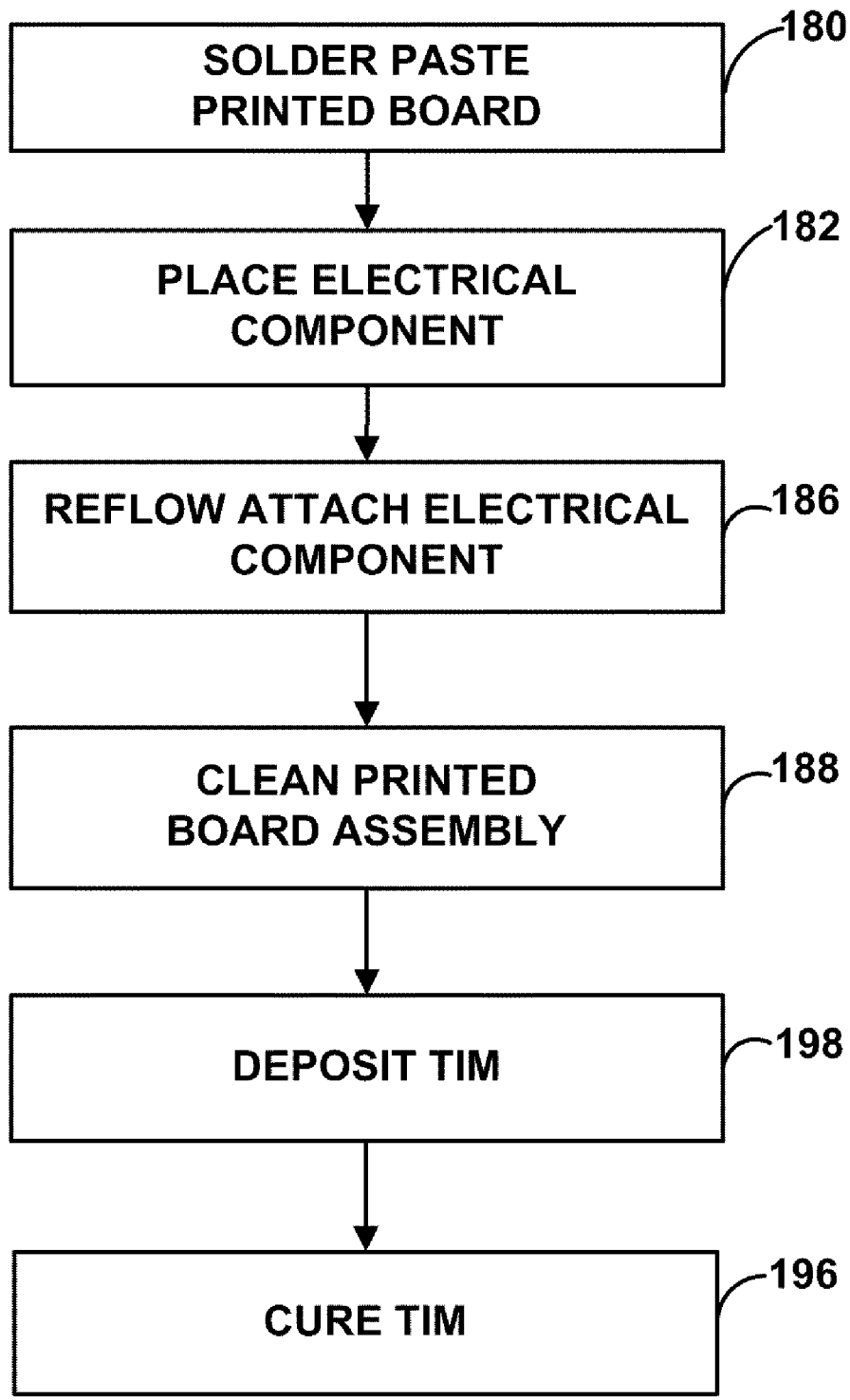
FIG. 7 is a flow diagram illustrating another example technique for forming an assembly with an electrical component and thermal interface material (TIM).

FIG. 7 is a flow diagram of an example technique for forming an assembly including a thermal interface material (TIM) that is thermally connected to an electrical component and a heat sink of a printed board. While FIG. 7 is described with reference to assembly 110 of FIG. 5, in other examples, the technique shown in FIG. 7 can be used to assemble another assembly. As with the technique shown in FIG. 6, solder paste is applied to printed board 4 at one or more solder mask defined attach pads to which one or more electrical components can be attached (180). One or more electrical components are positioned on printed board 4 and aligned with at least one attach pad (182). Thereafter, the one or more electrical components are reflow solder attached to printed board (186), e.g., using the techniques described above, and the printed board assembly is cleaned to remove solder flux or any other residues (188).

Thermal interface material is deposited on printed board 4 such that it is adjacent to, and, in some examples, in direct contact with, at least a portion of a side surface of an electrical component and a thermal attach pad to provide thermal communication between the electrical component and the thermal attach pad (198). For example, with respect to assembly 110 (FIG. 3), thermal interface material 124 can be deposited on printed board 4 such that it is adjacent side surface 13 of electrical component 12 and adjacent thermal attach pad 82. As another example, thermal interface material 126 can be deposited on printed board 4 such that it is adjacent (e.g., in direct contact with) side surface 13 of electrical component 12, adjacent thermal attach pad 82, and in thermal communication (e.g., direct or indirect contact) with thermal via 46B. In some examples, thermal interface material (TIM) 124 is physically separated from thermal interface material 126, while in other examples, thermal interface material (TIM) 124 is substantially contiguous with thermal interface material (TIM) 126. In addition, thermal interface material (TIM) 144, 146 can be deposited on printed board 4 such that it is adjacent (e.g., in direct contact with) side surface 19 of electrical component 14 and adjacent (e.g., in direct contact with) thermal attach pad 94. In some examples, thermal interface material (TIM) 144, 146 can be deposited on printed board 4 such that it is adjacent side surface 19 of electrical component 14, adjacent thermal attach pads 94, and in thermal communication (e.g., direct or indirect contact) with thermal vias 56B, 56A.

Thermal interface material (TIM) can be applied to printed board 4 using any suitable technique. In one example, thermal interface material is preshaped into a discrete element and has a predetermined volume. This preshaped piece of thermal interface material is then placed adjacent at least a portion of a side surface of an electrical component that is attached to printed board 4 and in thermal communication with one or more thermal vias of printed board. In another example, thermal interface material is injected or otherwise flowed or poured into the space on printed board 4 near a thermal via and adjacent at least a portion of a side surface of an electrical component that is attached to printed board 4. In some examples, depending on the type of the thermal interface material utilized, the thermal interface material may maintain its shape prior to curing. However, in other examples, the thermal interface material may be partially cured prior to being deposited on printed board 4. After depositing thermal interface material (198), the thermal interface material can be cured (196), e.g., as described above with reference to FIG. 6.

Although two adjacent electrical components are illustrated and described in relation to FIGS. 1-5, this disclosure is not limited a particular number or a particular configuration of electrical components on a printed board. The thermal management features (e.g., a thermal interface material alone or in combination with a thermal bridge, a thermal attach pad in thermal communication with a heat sink, and, in some examples a thermal via in thermal communication with a heat sink) are applicable to an individual component or a plurality components. The plurality of components may be mounted on a printed board adjacently or non-adjacently.

The assemblies of this disclosure may be capable of providing a number of advantages over conventional thermal management techniques for printed board assemblies. For example, the assemblies may include a relatively low impedance thermal path between an electrical component and one or more heat sinks. In some cases, a thermal bridge and a thermal interface material may efficiently conduct heat away from a relatively large surface area of an electrical component to a thermal bridge attach pad. For example, a thermal bridge that includes copper may efficiently transfer heat away from a high power electrical component. In further cases, a fillet of thermal interface material located at a periphery of an electrical component may efficiently transfer heat away from the electrical component. For instance, a fillet of thermal interface material may transfer heat to a thermal bridge attach pad even without a thermal bridge. Because thermal paths in the assemblies of this disclosure may be electrically isolated from an electrical component, a designer may separately optimize thermal and electrical conduction pathways using the thermal management features described herein.

Various embodiments of the invention have been described. These and other embodiments are within the scope of the following claims.

The invention claimed is:

1. An assembly comprising:
a printed board that includes a heat sink, a thermal conductive attach pad thermally connected to the heat sink, an electrically conductive attach pad that is separate from the thermally conductive attach pad, and an electrically conductive trace;
an electrical component electrically connected to the electrically conductive attach pad and the electrically conductive trace of the printed board, wherein the electrical component defines a side surface; and
a thermal interface material disposed adjacent at least a portion of the side surface of the electrical component, wherein the thermal interface material is thermally connected to the thermally conductive attach pad and the heat sink.

2. The assembly of claim 1, wherein the thermally conductive attach pad is electrically isolated from the electrically conductive attach pad and the electrically conductive trace.

3. The assembly of claim 1, wherein the printed circuit board comprises a plurality of conductive layers, the electrically conductive trace being defined by at least one of the conductive layers, and wherein the heat sink is defined by at least one of the conductive layers.

4. The assembly of claim 1, further comprising a thermal bridge that surrounds at least a portion of the side surface of the component, wherein the thermal interface material is disposed at least partially between the thermal bridge and the electrical component.

5. The assembly of claim 4, wherein the thermal bridge surrounds at least a portion of a top surface of the electrical component.

6. The assembly of claim 4, wherein the thermal bridge comprises at least one of copper, a copper alloy, tin plated steel, tin plated copper, or nickel plated copper.

7. The assembly of claim 4, further comprising a housing defining a cavity in which the electrical component is disposed, wherein the thermal bridge at least partially surrounds the housing and the thermal interface material is disposed between the thermal bridge and the housing.

8. The assembly of claim 1, wherein the printed board further comprises a thermally conductive via thermally connected to the heat sink and thermally connected to the thermally conductive attach pad.

9. The assembly of claim 8, further comprising an electrically conductive via electrically isolated from the thermally conductive via.

10. The assembly of claim 8, wherein the thermally conductive via extends through an entire thickness of the printed board.

11. The assembly of claim 1, wherein the heat sink comprises a thermal core heat sink.

12. The assembly of claim 1, wherein the electrical component comprises at least one of a transistor, diode, resistor, capacitor, inductor or integrated circuit.

13. The assembly of claim 1, wherein the thermal interface material comprises a thermal conductivity greater than approximately 10 Watts/meter-Kelvin.

14. An assembly comprising:
a printed board that includes a heat sink, a thermal conductive attach pad thermally connected to the heat sink, an electrically conductive attach pad that is separate from the thermally conductive attach pad, and an electrically conductive trace;
an electrical component electrically connected to the electrically conductive attach pad and the electrically conductive trace of the printed board, wherein the electrical component defines a side surface; and
a thermal bridge that surrounds at least a portion of the side surface of the electrical component; and
a thermal interface material disposed at least partially between the thermal bridge and the electrical component, wherein the thermal interface material is thermally connected to the thermally conductive attach pad.

15. The assembly of claim 14, wherein the electrically conductive attach pad is electrically isolated from the thermally conductive attach pad.

16. The assembly of claim 14, wherein the thermal bridge defines a fill port through which the thermal interface material is introduced between the thermal bridge and the electrical component.

17. A method comprising:
electrically connecting an electrical component to an electrically conductive attach pad of a printed board, wherein the printed board further comprises a thermally conductive attach pad thermally connected to a heat sink, and wherein the thermally conductive attach pad is separate from the electrically conductive attach pad; and introducing a thermal interface material adjacent at least portion of a side surface of the electrical component so the thermal interface material is thermally connected to the thermally conductive attach pad.

18. The method of claim 17, wherein electrically connecting the electrical component to the electrically conductive attach pad of the printed board comprises soldering the electrical component to a solder pad on a top surface of the printed board, wherein the solder pad is electrically connected to an electrically conductive trace disposed in the printed board.

19. The method of claim 17, further comprising attaching a thermal bridge to the printed board so the thermal bridge surrounds at least a portion of the side surface of the component, wherein introducing the thermal interface material comprises introducing the thermal interface material so the thermal interface material is disposed at least partially between the thermal bridge and the electrical component.

20. The method of claim 19, wherein the thermal bridge defines a fill port, and introducing the thermal interface material comprises introducing the thermal interface material into the fill port.

* * * * *